US012718878B2

(12) United States Patent
Contreras et al.

(10) Patent No.: US 12,718,878 B2
(45) Date of Patent: Aug. 25, 2026

(54) NAND DIE WITH WIRE-BOND INDUCTIVE COMPENSATION FOR ALTERED BOND WIRE BANDWIDTH IN MEMORY DEVICES

(71) Applicant: Sandisk Technologies, Inc., Milpitas, CA (US)

(72) Inventors: John Contreras, Palo Alto, CA (US); Nagesh Vodrahalli, Los Altos, CA (US); Md. Sayed Mobin, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 535 days.

(21) Appl. No.: 18/355,111

(22) Filed: Jul. 19, 2023

(65) Prior Publication Data

US 2024/0145424 A1 May 2, 2024

Related U.S. Application Data

(60) Provisional application No. 63/419,414, filed on Oct. 26, 2022.

(51) Int. Cl.

| | |
|---|---|
| ***G11C 11/56*** | (2006.01) |
| ***H10W 90/00*** | (2026.01) |
| *H10W 72/50* | (2026.01) |
| *H10W 90/24* | (2026.01) |

(52) U.S. Cl.

CPC ......... *G11C 11/5628* (2013.01); *H10W 90/00* (2026.01); *H10W 90/701* (2026.01); *G11C 2211/5641* (2013.01); *H10W 72/5453* (2026.01); *H10W 90/24* (2026.01); *H10W 90/754* (2026.01); *H10W 90/755* (2026.01); *H10W 90/794* (2026.01)

(58) Field of Classification Search

CPC ............................................ H01L 2224/48147

See application file for complete search history.

(56) References Cited

U.S. PATENT DOCUMENTS

| | | | |
|---|---|---|---|
| 11,362,063 B2 | 6/2022 | Xing et al. | |
| 2015/0333805 A1 | 11/2015 | Brauchler et al. | |
| 2018/0096777 A1 | 4/2018 | Akcasu | |
| 2018/0190621 A1 | 7/2018 | Yan et al. | |
| 2019/0206450 A1 | 7/2019 | Contreras et al. | |
| 2020/0381399 A1* | 12/2020 | Choi | H01L 23/50 |
| 2024/0079318 A1 | 3/2024 | Mobin et al. | |

FOREIGN PATENT DOCUMENTS

| | | |
|---|---|---|
| KR | 20150059068 A | 5/2015 |

* cited by examiner

*Primary Examiner* — Yu-Hsi D Sun

(74) *Attorney, Agent, or Firm* — DENTONS Durham Jones Pinegar

(57) ABSTRACT

A storage device includes a substrate of a memory package that includes a first pin pad, a controller mounted on the substrate and electrically connected to the first pin pad, the controller being configured to manage data communications on a data channel, and a first memory die. The first memory die includes a front pin pad electrically connected to the first pin pad of the substrate by way of a first bond wire, a rear pin pad, a conductor segment electrically connecting the front pin pad and the rear pin pad of the first memory die, and a plurality of memory cells configured to provide non-volatile storage accessible by way of the data channel.

20 Claims, 11 Drawing Sheets

NON-VOLATILE MEMORY SYSTEM
600
622
CONTROLLER
FRONT END MODULE
808
HOST INTERFACE
820
PHY
822
BACK END MODULE
810
834
ECC
824
RAID
828
SEQUENCER
826
MEMORY INTERFACE
830
FLASH CONTROL LAYER
832
MEDIA MANAGEMENT LAYER
838
BUFFER MANAGEMENT/BUS CONTROL
814
RAM
816
ROM
818
NON-VOLATILE MEMORY
608
OTHER DISCRETE COMPONENTS
840
TO HOST

NAND DIE WITH WIRE-BOND INDUCTIVE COMPENSATION FOR ALTERED BOND WIRE BANDWIDTH IN MEMORY DEVICES

CROSS-REFERENCE TO RELATED APPLICATIONS

The present application claims priority to U.S. Provisional Application 63/419,414 entitled "NAND DIE WITH WIRE-BOND INDUCTIVE COMPENSATION FOR ALTERED BOND WIRE BANDWIDTH IN MEMORY DEVICES", filed Oct. 26, 2022, the entire disclosure of which is hereby incorporated by reference in its entirety.

BACKGROUND

Semiconductor memory and storage devices are widely used in various electronic devices such as cellular telephones, digital cameras, personal digital assistants, medical electronics, mobile computing devices, and non-mobile computing devices. Semiconductor memory may include non-volatile memory or volatile memory. A non-volatile memory allows information to be stored and retained even when the non-volatile memory is not connected to a power source (e.g., a battery). Examples of non-volatile memory include flash memory (e.g., NAND-type and NOR-type flash memory) and Electrically Erasable Programmable Read-Only Memory (EEPROM).

Typical NAND-type memory packages provide one or more input/output (I/O) data channels from, for example, a substrate of a ball grid array (BGA) package through one or more stacked NAND memory dies (e.g., for greater storage capacity). Each of these I/O channels is typically serially connected from the substrate to each of the memory dies using a bond wire connecting a pin cap on the substrate to a pin cap on the memory die (e.g., an input pin or memory pad), or from pin cap on one memory die to a pin cap on another memory die. Each of these bond wire segments represents resistance and inductance in the I/O channel (e.g., where the I/O channel acts as a transmission line connecting portions of all of the memory dies to the BGA package. However, typical I/O channels with this conventional bond wired architecture presents significant impedance mismatch that leads to a restriction on bandwidth on the channel. What is needed is an architecture that can increase the bandwidth on such bond wired I/O channels.

SUMMARY

The present application describes a storage device that includes a substrate of a memory package. The substrate of a memory package includes a first pin pad. The storage device also includes a controller mounted on the substrate and electrically connected to the first pin pad, the controller being configured to manage data communications on a data channel. The storage device further includes a first memory die. The memory die includes a front pin pad electrically connected to the first pin pad of the substrate by way of a first bond wire, a rear pin pad, a conductor segment electrically connecting the front pin pad and the rear pin pad of the first memory die, and a plurality of memory cells configured to provide non-volatile storage accessible by way of the data channel.

The present application also describes a memory die. The memory die includes a first pin pad. The memory die also includes a second pin pad. The memory die also includes a conductor segment electrically connecting the first pin pad and the second pin pad by way of a single electrical circuit segment of a predetermined length, the conductor segment being a conductor land formed into a surface face of the memory die.

The present application further describes a storage device. The storage device includes a substrate of a memory package that includes means for electrically connecting a first pin pad of the memory package to a controller, thereby defining a data channel for data communications between at least the memory package and the controller. The storage device also includes a first memory die. The first memory die includes means for electrically connecting a front pin pad of the first memory die to the first pin pad of the substrate. The first memory die also includes means for electrically connecting the front pin pad and a rear pin pad of the first memory die by way of a conductor segment.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
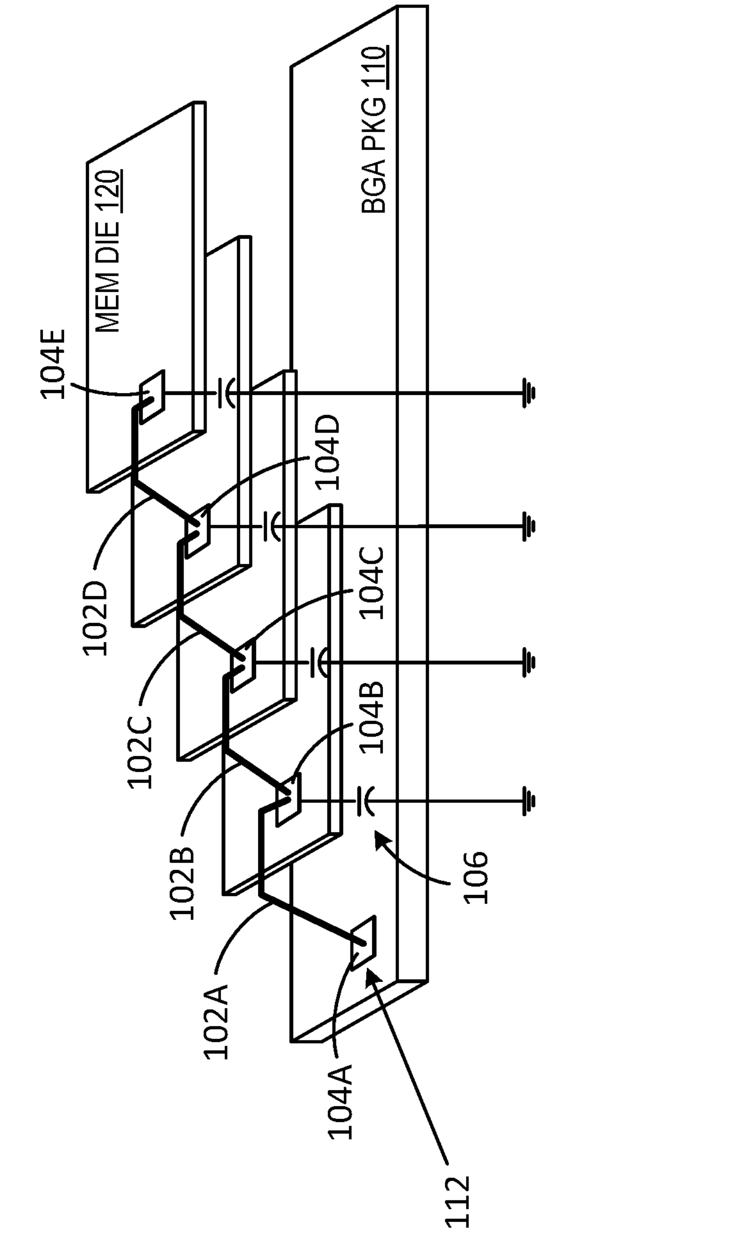
FIG. 1A illustrates a conventional memory package that includes a BGA package substrate upon which four memory dies (e.g., NAND memory dies) are mounted.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

In some NAND memory devices, bond wires are used to create I/O channels between a substrate of a memory package (e.g., a BGA package) and multiple NAND memory dies included in the package. Due to increased storage capacity needs, multiple NAND flash memory dies may be stacked in a highly integrated, complex package system. For example, some BGA packages may include 2, 4, 8, or 16 memory dies in a single package. These memory dies may be integrated together into one or more I/O channels using a "single-cap" bond wire architecture in which a pin cap of the package substrate is wired to a pin cap on the first memory die by way of a bond wire, then from the pin cap on the first memory die to a pin cap on a second memory die by way of another bond wire, and so on. The inductance using conventional pin cap to pin cap bond wiring typically limits the bandwidth on the I/O channels (e.g., due to impedance mismatch between high impedance source and terminations of a given channel and low impedance transmission segments within the channel). As used herein, the term "pin cap" refers to a bond pad, for example a bond pad formed on a substrate or a bond pad formed on a semiconductor chip, where an electrical connection between a chip and the substrate or the chip and another chip may be made, such as with a bond wire or a solder ball in the case of a flip-chip connection.

In order to provide increased bandwidth on these I/O channels, the present application describes an architecture that introduces additional impedance into segments of the I/O channels such that the bandwidth of these segments can be greatly increased. In an example, each memory die includes one or more pairs of pin caps (e.g., one pair for each I/O channel supported by the memory die). Each pair of pin caps is separated by an electrical connector, such as a bond wire segment (an "intermediate bond wire" or "intermediate segment" of a particular length) or a conductor land, that introduces additional impedance in the I/O channel before connecting into the internal NAND circuitry of the memory die itself, as well as bond wiring out to the next memory die. For example, for a given I/O channel, the substrate of a memory package is bond wired from a pin cap on the substrate to a "front pin cap" of a first memory die, and the "rear pin cap" of that first memory die is bond wired to a front pin cap of a second memory die, and so forth through to the last memory die. A conductor land may be formed between, or a length of intermediate bond wire may be extended between, the front pin cap to the rear pin cap, and may wrap around either the front or the rear pin cap before terminating at the rear pin cap.

In this example, each intermediate bond wire on the I/O channel increases impedance on a segment of the channel by a predetermined amount (e.g., based on the dimensions of the intermediate segment) such that the I/O channel may support a greater bandwidth. Modeling of this architecture demonstrates that an increase in impedance from, for example, 200 picohenry (pH) to 600 picohenry inductance in each bond wire+intermediate bond wire segment yields an increase in bandwidth of that total segment from 2 gigahertz (GHz) to 13 Ghz. Accordingly, the addition of this intermediate segment within each memory die increases overall bandwidth of the channel. Similarly, memory packages are also described that provide such intermediate connections with intermediate bond wires or conductor lands on multiple I/O channels, and with varying numbers of dies per channel.

These various benefits and examples will be described in greater detail below with reference to FIG. 1-FIG. 8.

Figure 1B:
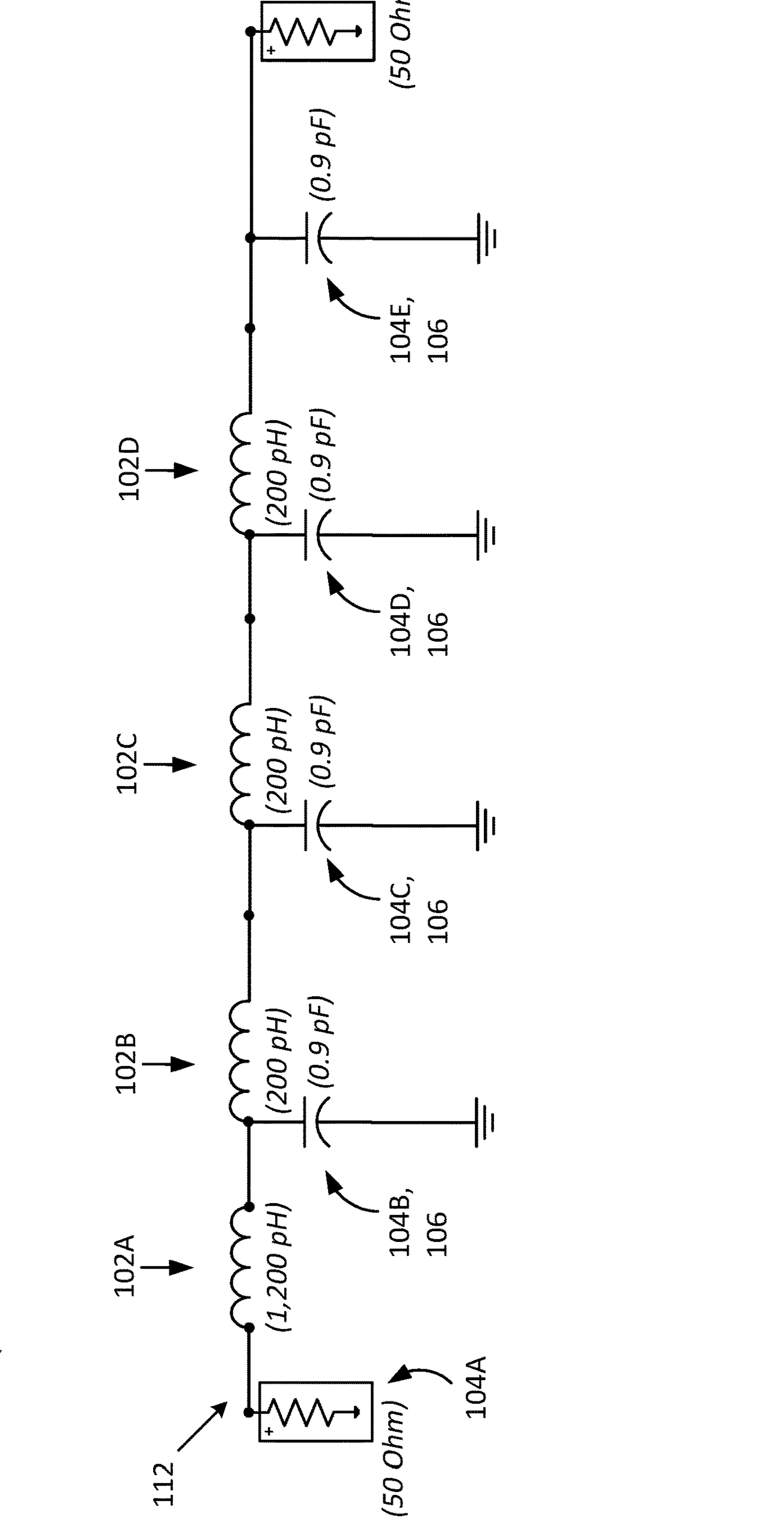
FIG. 1B is a model of an electrical diagram of the I/O channel shown in FIG. 1A along with various example electrical parameters associated with the channel.
Figure 1C:
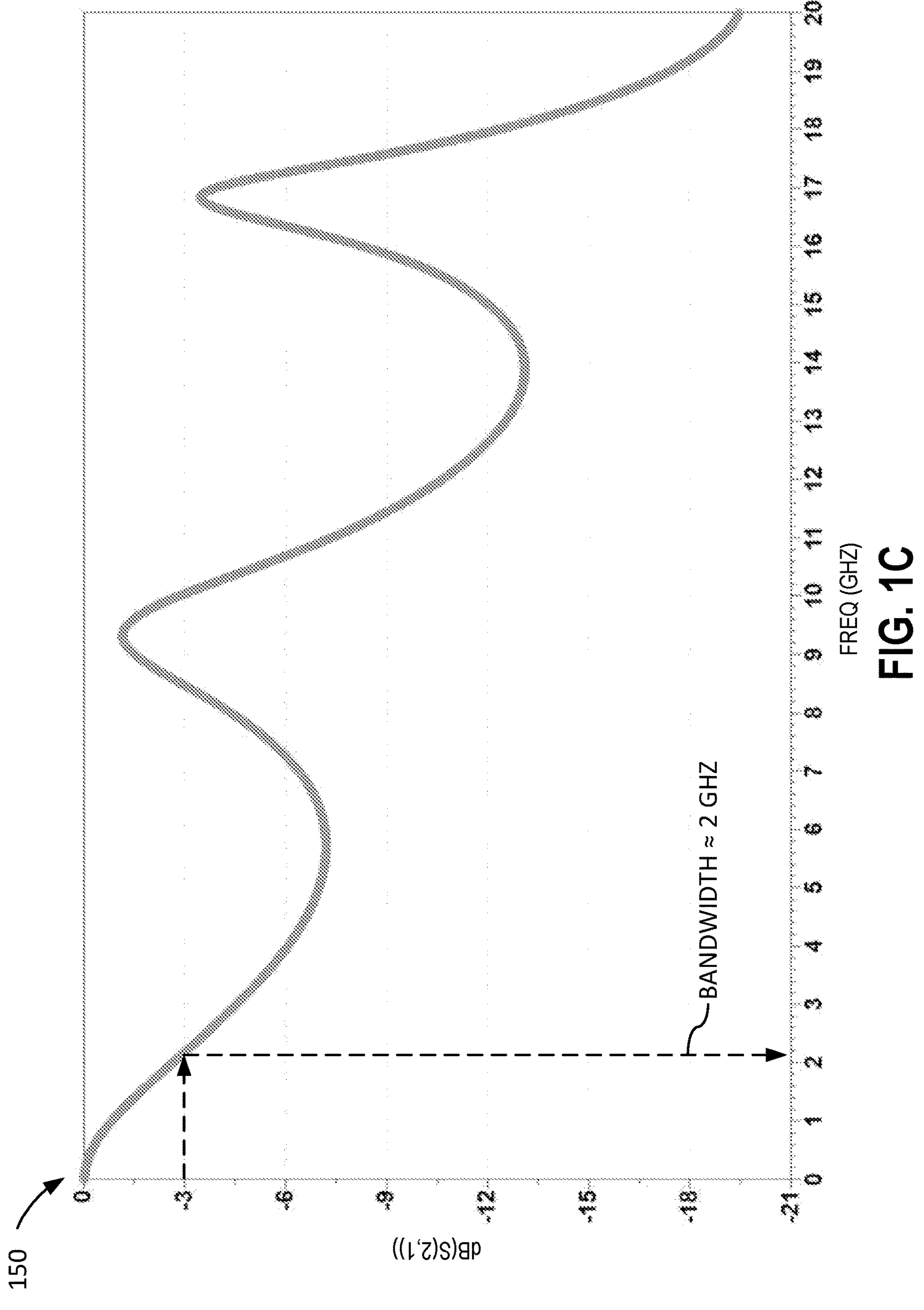
FIG. 1C is an example graph illustrating bandwidth limitations of the bond wire architecture shown in FIG. 1A and FIG. 1B.

FIGS. 1A-1C illustrate a conventional single-cap bond wire architecture of a memory package 100. As shown in FIG. 1A, the memory package 100 includes a BGA package substrate 110 upon which four memory dies 120 (e.g., NAND memory dies) are mounted. The example memory package 100 shows one I/O channel (or just "channel") 112 through which the BGA package 110 and each of the memory dies 120 communicate (e.g., passing data input/output operations and responses back and forth). Each memory die 120 may be, for example, a NAND flash memory die that includes internal circuitry (not shown) for providing volatile or non-volatile storage. It should be understood that FIG. 1A presents separation between the memory dies 120 and between the BGA package 110 for purposes of illustration, and that many other circuitry details regarding the memory dies 120 and memory package 100 that are not particularly pertinent to the present disclosure are excluded for ease of discussion.

In this example, the BGA package 110 and each of the memory dies 120 include a single pin cap 104A-E. For example, the BGA package 110 includes a pin cap 104A, and each of the memory dies 120 include pin caps 104B through 104E, respectively. These pin caps, or "I/O pads", 104 are used to connect the internal circuitry of the memory die 120 to the I/O channel 112. Each of the memory dies 120 presents underlying circuitry (e.g., NAND memory circuitry) that is represented as a capacitance 106 in FIG. 1A, stemming from the pin caps 104B-104E on each memory die 120.

More specifically, each of the pin caps 104 are connected, by way of one or two bond wires 102, with neighboring memory dies 120 or with the BGA package 110 itself. The bond wires 102 represent an electrical connection (e.g., a wire) that may be soldered to, or otherwise electrically connect to, pin caps 104. In the example shown in FIG. 1A, a bond wire 102A connects a pin cap 104A on the surface of a substrate of the BGA package 110 and a pin cap 104B of the first memory die 120. Similarly, another bond wire 102B connects the pin cap 104B of the first memory die 120 to a pin cap 104C of the second memory die 120, and so on for bond wire 102C connecting pin cap 104C to pin cap 104D, and bond wire 102D connecting pin cap 104D to pin cap 104E. As such, the series of bond wires 102 establishes a data transmission path that is the channel 112 shared by all of the memory dies 120 and the BGA package 110.

FIG. 1B is a model of an electrical diagram 140 of the I/O channel 112 shown in FIG. 1A along with various example electrical parameters associated with the channel 112. In this example, the four bond wires 102A and 102B-102D are represented with inductances of L=1,200 pH and L=200 pH, respectively. Each of the pin caps 104B-104E on the memory dies 120 are represented with capacitances 106 of C=0.9 picofarad (pF). The channel 112 also includes the pin cap 104A (e.g., Z=50 Ohm), which represents a transmission segment within the circuitry of the BGA package 110. Since the bond wire 102B-D segments in the channel 112 represent low impedance segments (e.g., $Z_o \approx 14.9$ Ohm), there is a significant impedance mismatch between the low impedance segments and the high impedance segments.

In this example, the channel 112 presents an impedance mismatch that causes reflection and associated signal loss at certain points, and this signal reflection limits the bandwidth on the channel. For example, a reflection coefficient, r, between a 50 Ohm segment and a 14.9 Ohm segment can be calculated as:

$$r = \frac{50 - 14.9}{50 + 14.9} = \frac{35.1}{64.9} = 0.54.$$

This reflection coefficient between segments with an impedance mismatch causes a percentage of signal loss that limits the overall bandwidth of the channel.

FIG. 1C is an example graph 150 illustrating bandwidth limitations of the bond wire architecture shown in FIG. 1A and FIG. 1B. In this example, the graph 150 includes a plot of frequency (in GHz, X-axis) versus insertion loss (S(2,1), in decibels (dB), Y-axis) (e.g., due in part to the signal loss caused by reflection at the mismatched impedance). In this example, $$Y = \mathrm{dB}(S(2, 1)) = \log_{10}\frac{V_2}{V_1},$$

where $V_1$ is the signal voltage at the beginning of the channel 112 and $V_2$ is the signal voltage at the end of the channel 112. As such, when there is no voltage loss between the beginning and end of the channel (e.g., when $V_2=V_1$), then Y=0. At Y=−3, 70% of the signal is will pass, and 30% will get blocked.

Figure 2A:
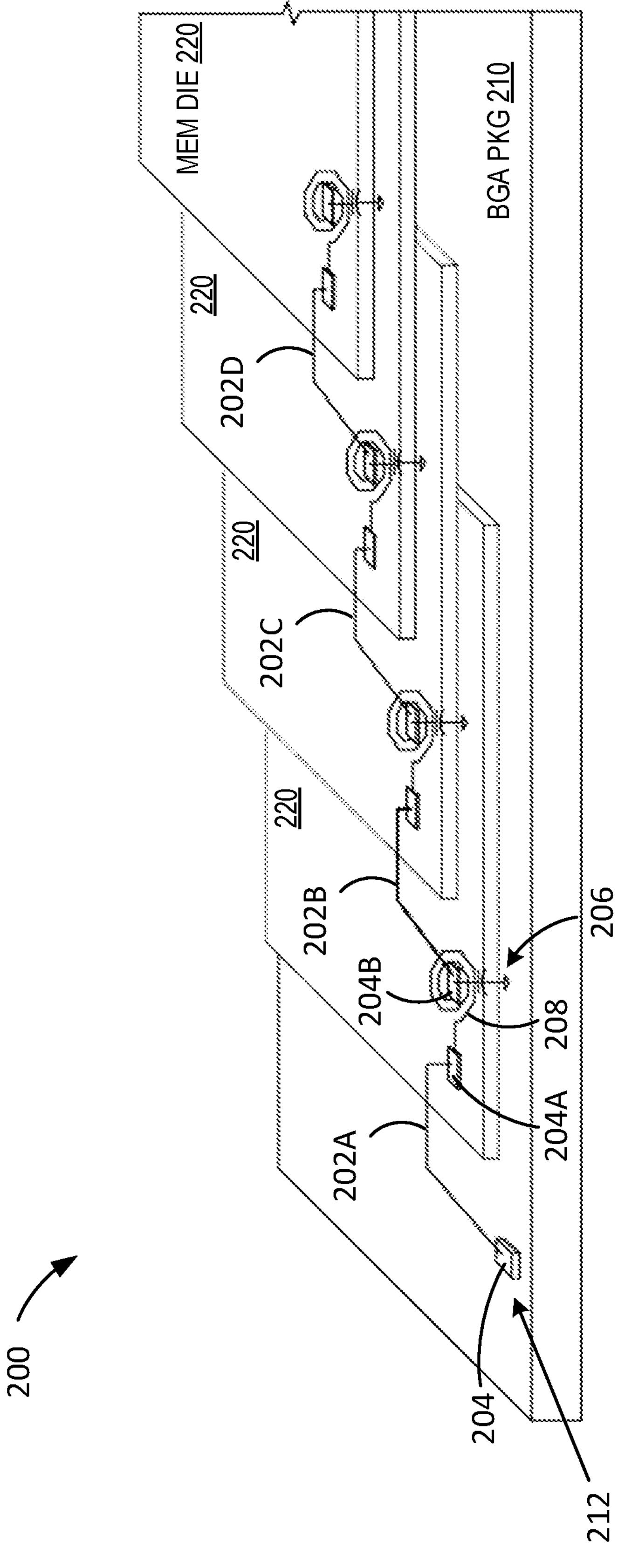
FIG. 2A is an example architecture of a memory package that implements intermediate conductor segments (or just "intermediate conductors") between pairs of pin caps within memory dies to improve maximum bandwidth on an I/O channel.
Figure 2B:
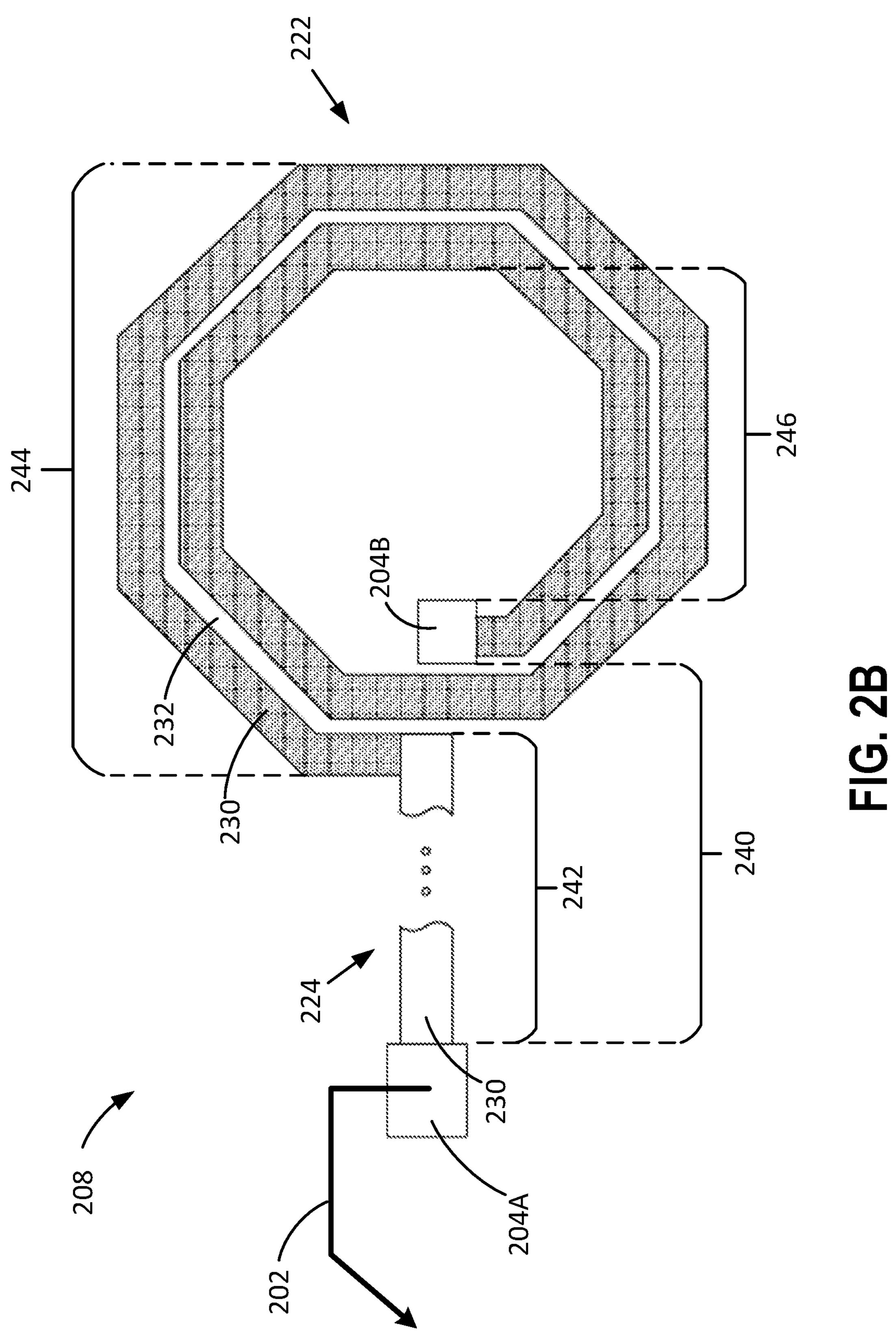
FIG. 2B is a diagram of a first example of the intermediate conductor segment shown in FIG. 2A.

FIG. 2A is an example architecture of a memory package 200 that implements intermediate conductor segments (or just "intermediate conductors") 208 between pairs of pin caps 204A, 204B within memory dies 220 to improve maximum bandwidth on an I/O channel 212. In the example shown in FIG. 2A, each memory die 220 includes a pair of pin caps 204A, 204B for the data transmissions on the channel 212. Running between each pair of pin caps 204A, 204B is an intermediate conductor segment 208 formed on or into a surface of the memory die 220 (e.g., etched within the memory die 220). In some examples, the conductor segments 208 are bond wires, where in other examples, the conductor segments are conductor lands. For example, the spiral inductors may be constructed using a p-type substrate with stacked passivation oxidation, dielectric, and metal levels. A metal layer is utilized between dielectric layers to construct a physical spiral metal routing to create an inductor in the signal path. The spiral construction is connected between the two pads 204A and 204B, as shown in FIG. 2B. The intermediate conductor segment 208 connects the "front" pin cap 204A of a memory die 220 (e.g., the pin cap 204A nearest the pin cap 204 of the BGA package 210) with the "rear" pin cap 204B of the memory die 220. The intermediate conductor segment 208 forms a single wired path of a predetermined length that, in an example, winds around the rear pin cap 204B (e.g., at least across a separation distance between the two pin caps 204A, 204B, and perhaps longer using a coiling routing around the rear pin cap to achieve the predetermined length). Further, the internal circuitry of the memory die 220 (e.g., the NAND circuitry) are connected to the rear pin cap 204B within the memory die 220, as illustrated here by a "lump" capacitance 206.

FIG. 2B is a diagram of a first example of the intermediate conductor segment 208 shown in FIG. 2A. In this example, a conductor land 230 is used to connect the front pin cap 204A to the rear pin cap 204B. The front pin cap 204A and the rear pin cap 204B are separated, on the memory die 220, by a separation distance 240. The intermediate conductor segment 208, and its associated conductor land 230, is configured with dimensions such as to add a predefined additional impedance to a segment of the channel 212 (e.g., prior to the next lump capacitance 206 on the channel 212).

As shown in FIG. 2B, the intermediate conductor segment 208 includes a first segment (or "straight segment") 224 of conductor land 230 and a second segment (or "coiled segment") 222 of conductor land 230. The straight segment 224 extends from the front pin pad 204A toward the rear pin pad 204 by a first length 242 which, in this example, covers most of the separation distance 240 between the two pin pads 204A, 204B. Prior to connecting to the rear pin pad 204B, the conductor land 230 wraps around the rear pin pad 204B (e.g., in a geometric shape, such as circular, rectangular, octagonal, or the like) one or more times, or portions thereof. The second segment 222 defines a second length (not separately illustrated in FIG. 2B) that, when added to the first length 242, defines a total length of the intermediate conductor segment 208.

In this example, the straight segment 224 of conductor land 230 has a width of between 5 and 25 microns (μm) and a total length of between 10 and 30 microns. The coiled segment 222 of the conductor land 230 has a width of five microns and is separated by a separation distance 232 of two microns. The outermost diameter 244 of the coiled segment 222 is 50 microns in the example (e.g., between 40 and 60 microns), reducing to an innermost diameter of 28 microns (e.g., between 18 and 38 microns). The dimensions of the pin pads 204A, 204B are 60×65 microns, and the separation distance 240 between the two pin pads 204A and 204B is between 21 and 41 microns. Accordingly, the total path length of the bond wire 230 between the first pin pad 204A and the second pin pad 204B is between 226 microns and 246 microns, between 200 and 300 microns, or with a length and width such as to add an additional impedance of 50 Ohms (the "target" additional impedance).

In another example (not shown), the intermediate conductor segment 208 may begin, at the front pin pad 204A, with a coiled segment 222 (e.g., wrapping around the front pin pad 204A, and coiling outward, thereby increasing in diameter) and may end with a straight segment 224 (e.g., extending from an outer edge of the coiled segment 222 to the rear pin pad 204B). In yet another example (not shown), the intermediate conductor segment 208 may have a coiled segment 222 around the front pin pad 204A and another coiled segment 222 around the rear pin pad 204B.

Figure 2C:
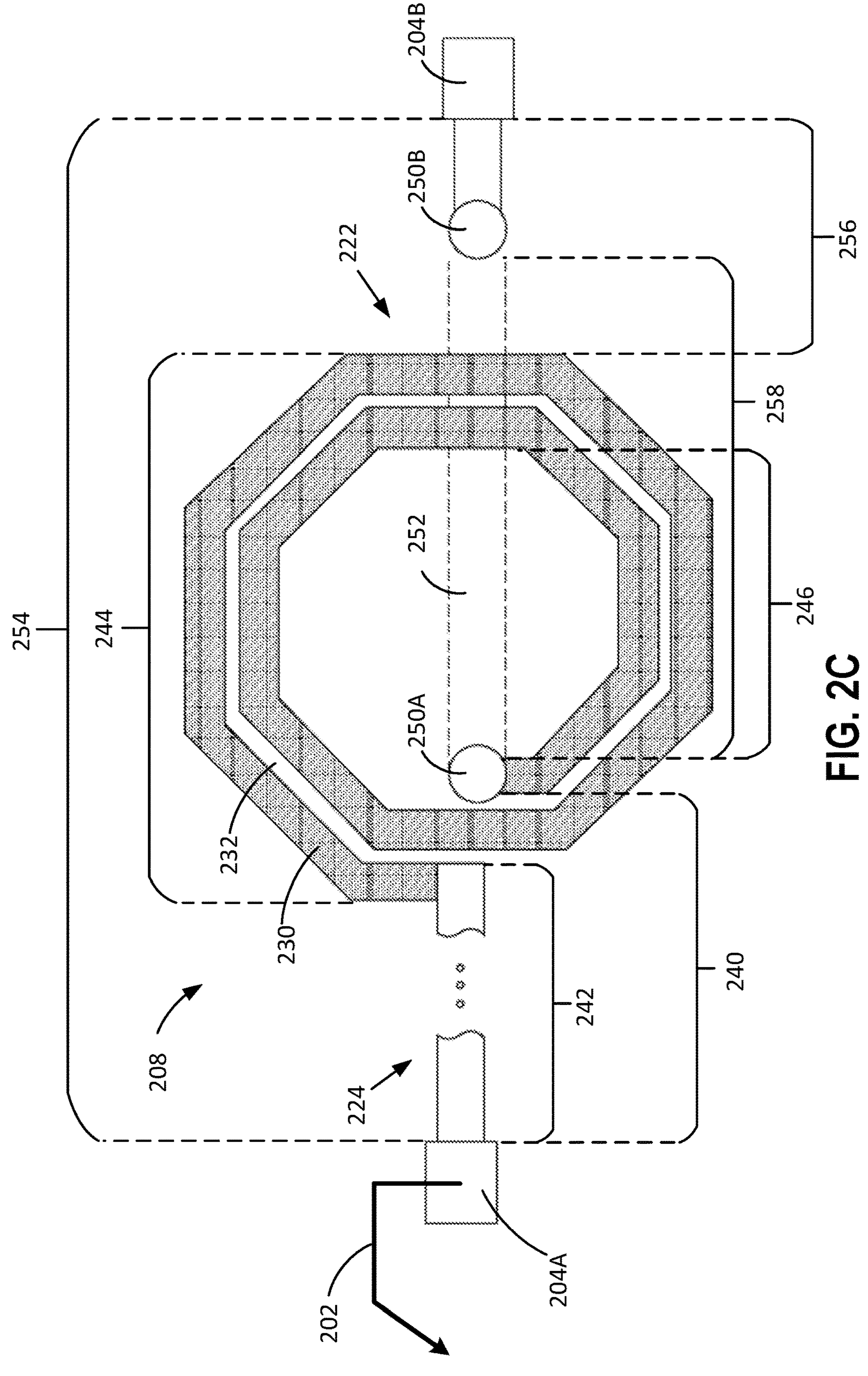
FIG. 2C is a diagram of a second example conductor segment that may be used with the memory package shown in FIG. 2A.

FIG. 2C is a diagram of a second example conductor segment 208 that may be used with the memory package 200 shown in FIG. 2A. In this example, the conductor segment 208 includes a straight segment 224 and a coiled segment 222 similar to the example shown in FIG. 2B. However, at the interior of the coiled segment 222, the conductor land 230 connects instead to a via 250A. The via 250A drops down into (e.g., in a lower layer beneath the surface of) the memory die 220 and extends, with a metal land 252 (shown in broken line to indicate traversal in a lower layer/plane), toward the rear pin pad 204B. Once the metal land 252 is outside of the coiled segment 222, another via 250B brings the path up to the surface of the memory die 220, and runs along the surface of the memory die 220 to terminate at the rear pin pad 204B.

In this example, the straight segment 224 of conductor land (e.g., bond wire) 230 has a width of between 5 and 25 microns (μm) and a total length of between 10 and 30 microns. The coiled segment 222 of the conductor land 230 has a width of five microns and is separated by a separation distance 232 of two microns. The outermost diameter 244 of the coiled segment 222 is 50 microns in the example (e.g., between 40 and 60 microns), reducing to an innermost diameter of 28 microns (e.g., between 18 and 38 microns). The dimensions of the pin pads 204A, 204B are 60×65 microns. A separation distance 258 between the two vias 250A and 250B is between 42 and 65 microns, and a separation distance between the first via 250A and the rear pin pad 204B is between 44 and 65 microns. A total separation distance 254 between the pin pads 204A, 204B may be between 60 and 100 microns. Accordingly, the total path length of the conductor land 230 between the first pin pad 204A and the second pin pad 204B is between 271 microns and 311 microns, between 250 microns and 350 microns, or with a length and width such as to add an additional impedance of 50 Ohms (the "target" additional impedance).

Figure 3:
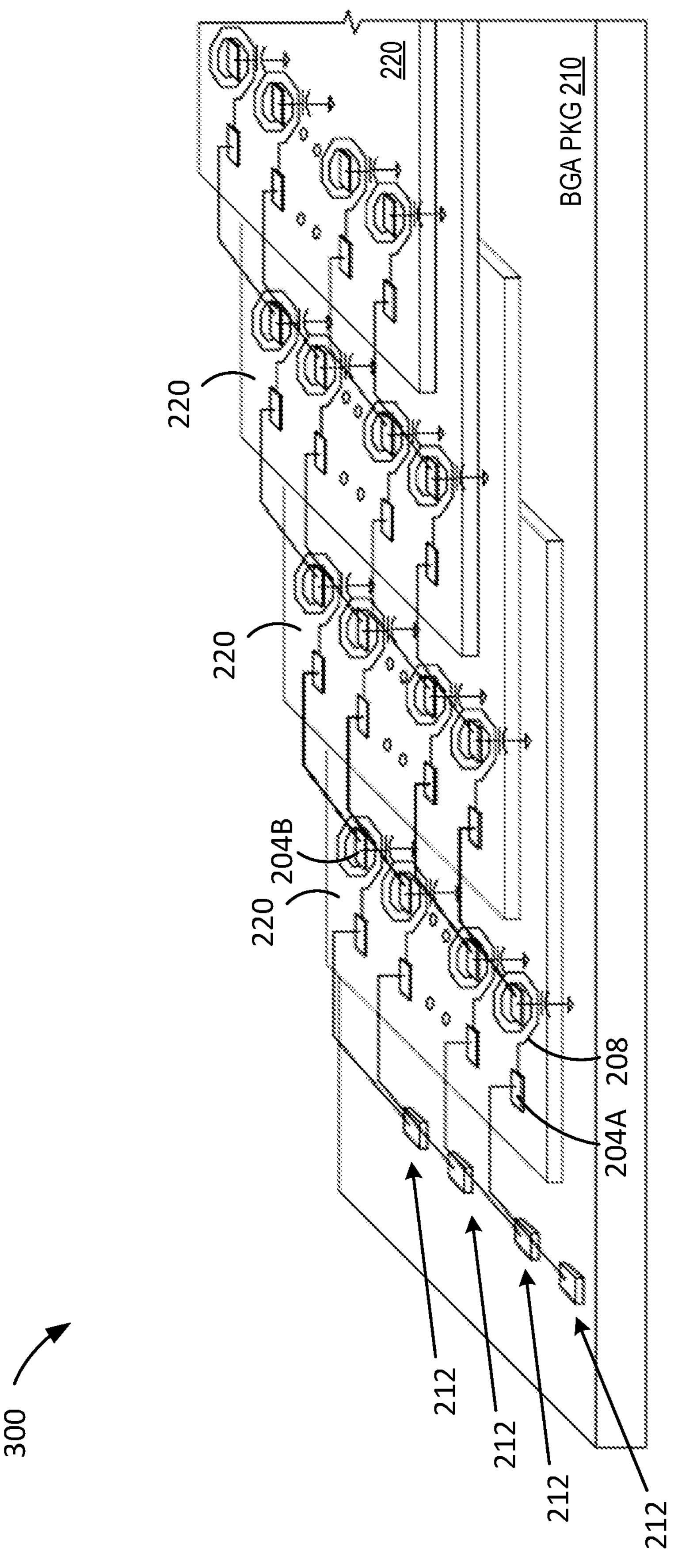
FIG. 3 is another example architecture of a memory package that implements intermediate bond wire segments similar to the memory package of FIG. 2A.

FIG. 3 is another example architecture of a memory package 300 that implements intermediate conductor segments 208 similar to the memory package 200 of FIG. 2A. In this example, a BGA package 310 includes multiple I/O channels 212 (e.g., 2, 4, 8, or 16 channels), each of which is bond wired from an individual pin pad 204 on the BGA package 310 out to memory dies 320. Each of the memory dies 320 includes multiple pairs of pin pads 204A, 204B, each of which is similarly connected by way of an intermediate conductor segment 208. It should be understood that more or fewer channels 212 may be supported by the BGA package 310 and by the memory dies 320, that more or fewer memory dies 320 may be supported by the BGA package 310 on each of the channels 212, and that additional sets of channels 212 and memory dies 320 may be included on the BGA package 310. In the example, the channels 212 are separated from each other (e.g., on the BGA pkg 210 and on the memory dies 220) by 150 microns (e.g., between 100 and 200 microns).

In the example shown in FIG. 3, the intermediate conductor segment 208 of FIG. 2B is implemented (e.g., with the coiled segment 222 surrounding the rear pin pad 204B). In another example (not shown), the intermediate conductor segment 208 of FIG. 2B may be implemented with the coiled segment 222 surrounding the front pin pad 204B. In another example (not shown), the intermediate conductor segment 208 of FIG. 2C may be implemented (e.g., with pairs of vias 250 extending the channel 212 through another layer of the memory dies 220 to emerge outside of the coiled segments 222 before connecting to the rear pin pad 204B).

Figures 6, 7:
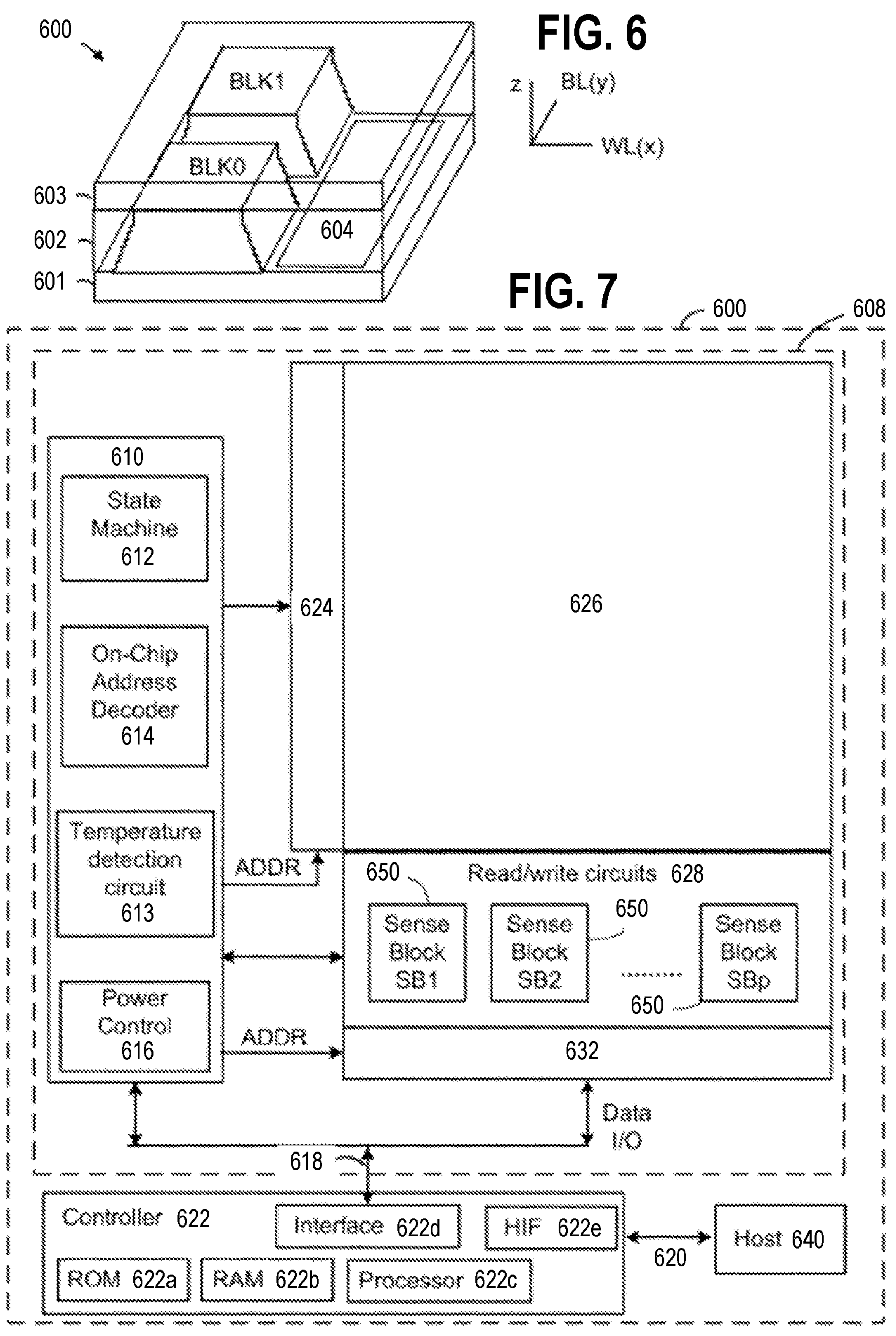
FIG. 6 is a perspective view of a storage system that includes three-dimensional (3D) stacked non-volatile memory.
FIG. 7 is a functional block diagram of an example storage device, such as the 3D stacked non-volatile storage device of FIG. 6.
Figure 8:
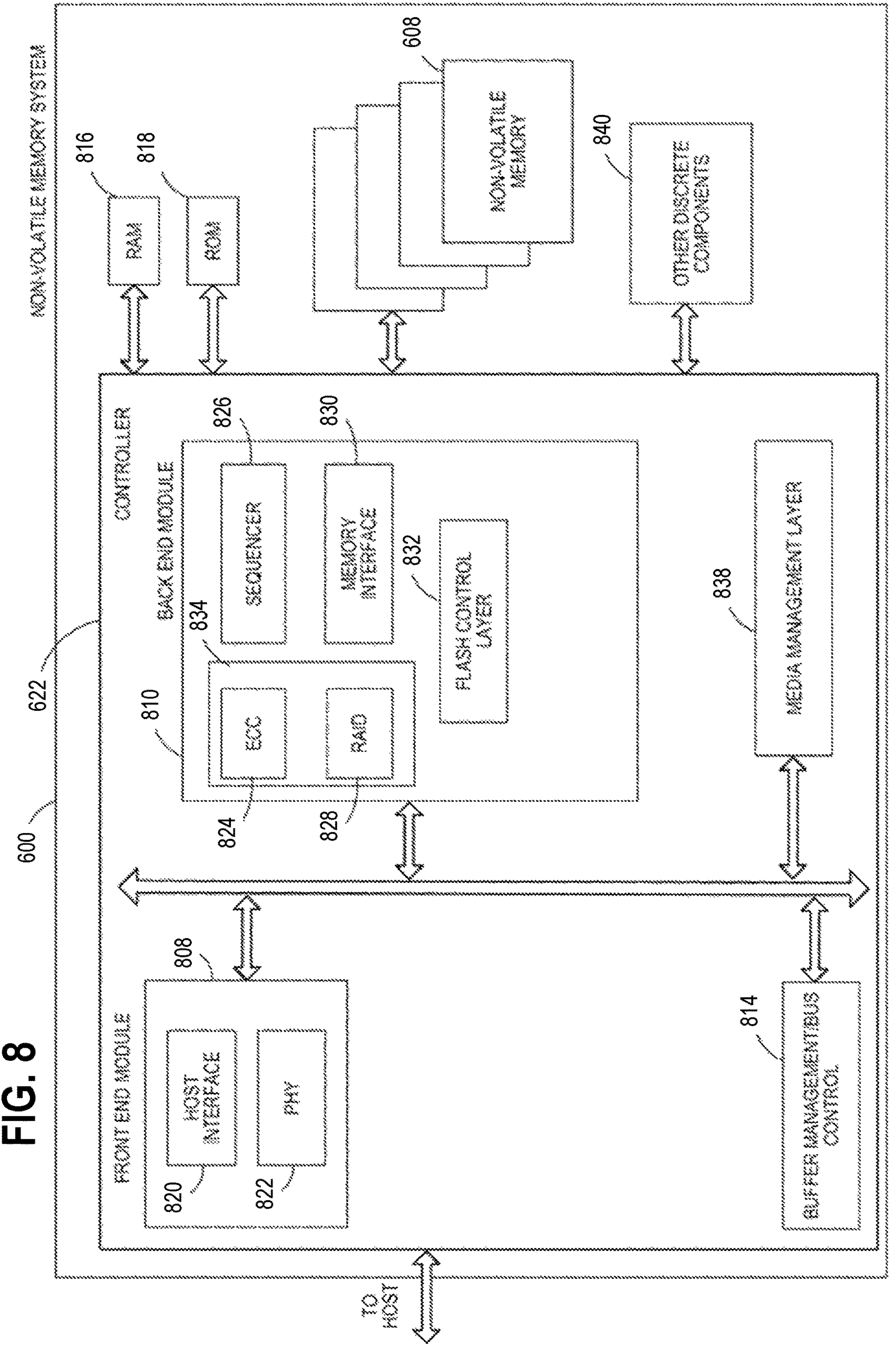
FIG. 8 is an example block diagram of example storage system, depicting more details of the controller.

Referring now to FIG. 2A and FIG. 3, the pin cap 204 of the BGA packages 210, 310 connect the I/O channel 212 to a controller such as the controller 622 shown in FIG. 7-FIG. 8. In the configurations shown in FIG. 2A and FIG. 3, the memory packages 200, 300 may be configured to operate the I/O channels 212 at any frequency up to the 13 GHz threshold (e.g., 3.6 GHz, 4.8 Ghz, or the like).

Figure 4:
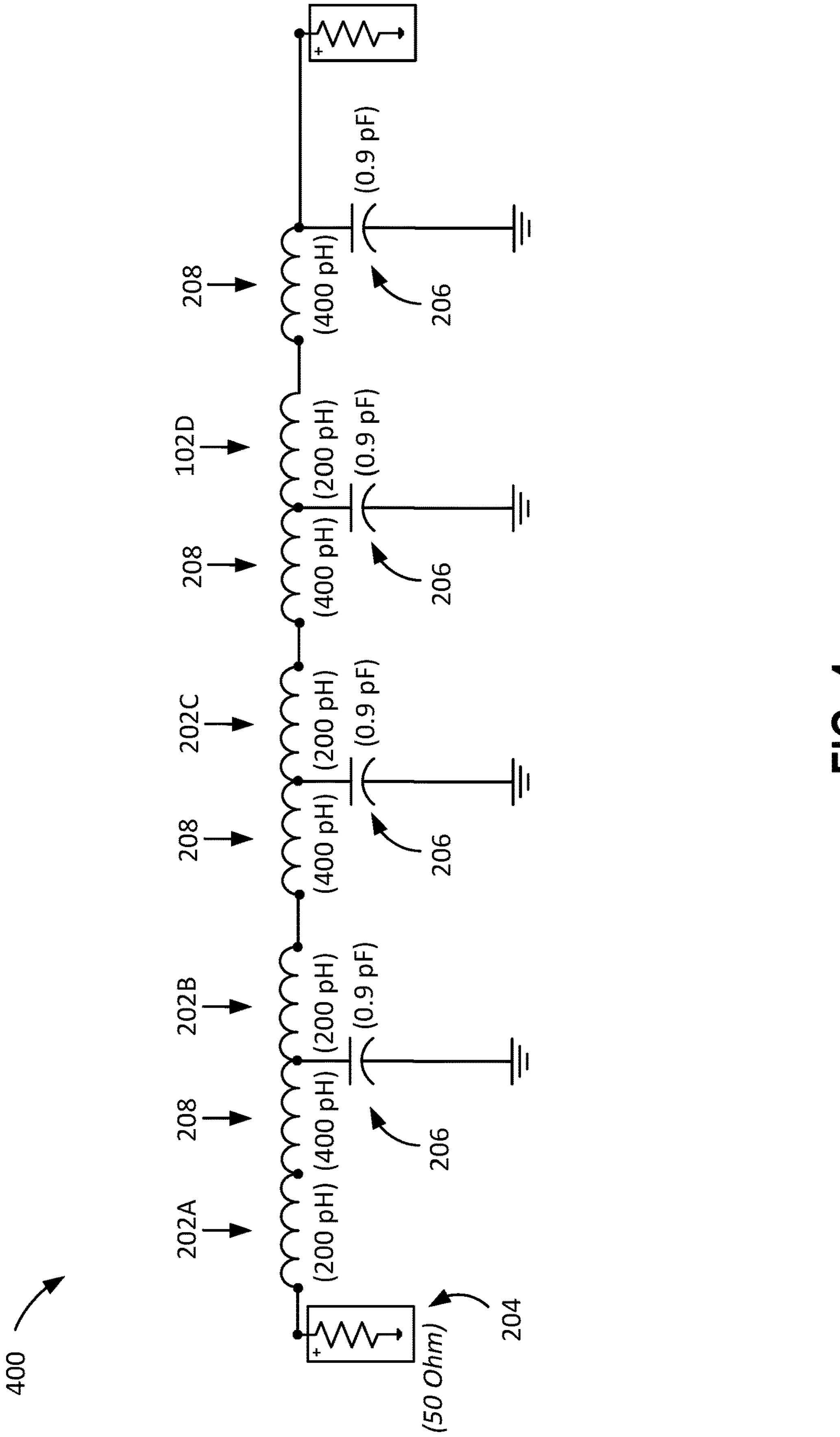
FIG. 4 is a model of an electrical diagram of the I/O channels shown in the memory packages of FIG. 2 and FIG. 3, along with various example electrical parameters associated with the channel.

FIG. 4 is a model of an electrical diagram 400 of the I/O channels 212 shown in the memory packages 200, 300 of FIG. 2A and FIG. 3, along with various example electrical parameters associated with the channel 212. In the example, the four bond wires 202A and 202B-102D are represented with inductances of L=200 pH. Each of the rear pin caps 204B on the memory dies 220 are represented with capacitances 206 of C=0.9 picofarad (pF). The channel 212 also includes the pin cap 204 (e.g., Z=50 Ohm), which represents a transmission segment within the circuitry of the BGA package 110.

Further, each of the intermediate conductor segments 208 is represented in the diagram 400 as an additional inductance of L=400 pH (e.g., between 300 and 500 pH) on an associated segment of the channel 212 (e.g., in serial connection prior to the respective capacitance 206, in front to rear terms). As such, in the example, each segment having a bond wire 202 in conjunction with an intermediate conductor segment 208 forms a total inductance of 700 pH (e.g., between 600 and 800 pH). For higher pad capacitance, coil turns routing can be increased to achieve higher inductance values (e.g., above 1 nH).

In an example, the intermediate conductor segments 208 are modeled as a microstrip, which is a type of transmission line where the conductor is surrounded by two different dielectric materials above and below the routing. For an inductance of ~0.400 pH, the intermediate conductor segments 208 are created having a conductor with a length of 1,200 μm (micron) and a width of 10 μm. In other examples, the length and width may be varied, but still arrive at an inductance at or near 400 pH. In some examples, the dielectric materials surrounding the conductor may be silicon oxide (e.g., with a dielectric constant=4 at 1 GHz) and Air (dielectric constant=1 at all frequencies). In some examples, the length of the intermediate conductor segments 208 may be between 1,000 and 1,400 μm. In some examples, the width of the intermediate conductor segments 208 may be between 8 and 12 μm. In some examples, the target inductance may be between 300 pH and 500 pH. In some examples, the additional inductance provided by the intermediate conductor segments 208 may be provided based on the resistance of the highest segment on the channel 112. In some examples, the inductance added by the intermediate conductor segments 208 is greater than or equal to 100 pH or greater than or equal to 300 pH (e.g., a combination of conductor length and width such as to yield at least such target inductance).

Figure 5:
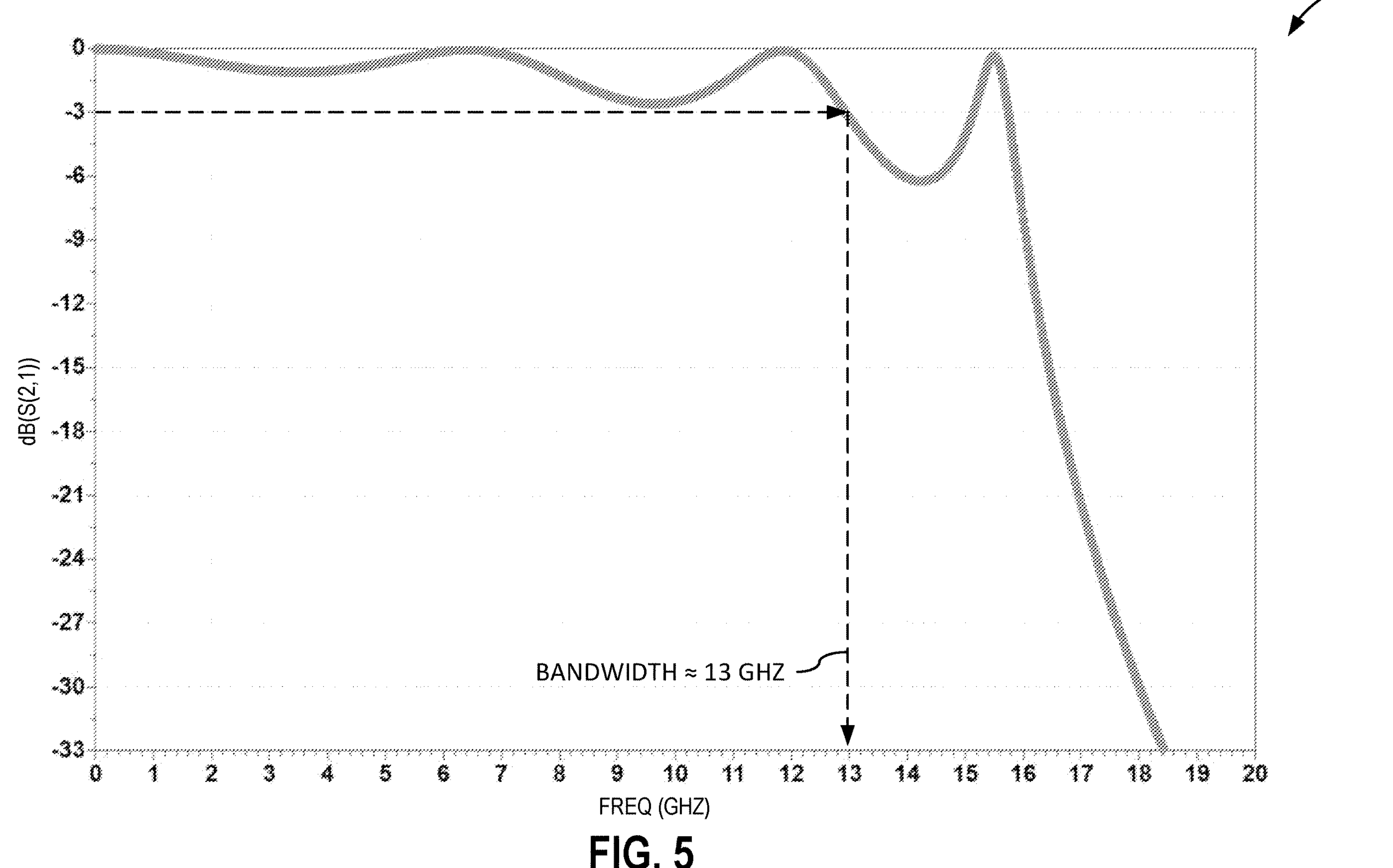
FIG. 5 is an example graph illustrating bandwidth limitations of the bond wire architecture shown in FIG. 2-FIG. 4.

FIG. 5 is an example graph 500 illustrating bandwidth limitations of the architecture shown in FIGS. 2-4. In the example, the graph 500 includes a plot of frequency (in GHz, X-axis) versus insertion loss (S(2,1), in decibels (dB), Y-axis) (e.g., due in part to the signal loss caused by reflection at the mismatched impedance). At −3.0 dB, a bandwidth of approximately 13 GHz is achievable by using the intermediate conductor segments 208 of FIGS. 2A-4. In comparison with the architecture of FIGS. 1A-1C, and particularly as shown in FIG. 1C, the improved intermediate bond wire segment architecture of FIGS. 2A-4 allows for increasing the bandwidth of the I/O channels 212 from 2 GHz to 13 GHz.

FIGS. 6-8 describe one example of a storage system that can the memory packages 200, 300 and memory dies 220, 320 of FIGS. 2A-3. In some examples, the memory packages 200, 300 are similar to the storage device 600 and the memory dies 220, 320 are similar to the memory dies 608 shown in FIGS. 6-8. FIG. 6 is a perspective view of a storage device 600 that includes three-dimensional (3D) stacked non-volatile memory. The storage device 600 includes a substrate 601. On and above the substrate are example blocks of memory cells, including BLK0 and BLK1, formed of memory cells (non-volatile memory elements). Also on substrate 601 is peripheral area 604 with support circuits for use by the blocks. Substrate 601 can also carry circuits under the blocks, along with one or more lower metal layers which are patterned in conductive paths to carry signals of the circuits. The blocks are formed in an intermediate region 602 of the storage device 600. In an upper region 603 of the storage device 600, one or more upper metal layers are patterned in conductive paths to carry signals of the circuits. Each block of memory cells includes a stacked area of memory cells, where alternating levels of the stack represent word lines. While two blocks are depicted as an example, additional blocks can be used, extending in the x- and/or y-directions.

In one example implementation, the length of the plane in the x-direction represents a direction in which signal paths for word lines extend (e.g., a word line or drain-end select gate (SGD) line direction) and the width of the plane in the y-direction represents a direction in which signal paths for bit lines extend (e.g., a bit line direction). The z-direction represents a height of the storage device 600.

FIG. 7 is a functional block diagram of an example storage device, such as the 3D stacked non-volatile storage device 600 of FIG. 6. The components depicted in FIG. 7 are electrical circuits. Storage device 600 includes one or more memory dies 608. Each memory die 608 includes a three-dimensional memory structure 626 of memory cells (e.g., a 3D array of memory cells), control circuitry 610, and read/write circuits 628. In other examples, a two-dimensional array of memory cells can be used. Memory structure 626 is addressable by word lines using a decoder 624 (e.g., row decoder) and by bit lines using a column decoder 632. The read/write circuits 628 include multiple sense blocks 650 including SB1, SB2, . . . , SBp (e.g., sensing circuitry) and allow a page of memory cells to be read or programmed in parallel. In some systems, a controller 622 is included in the same storage device 600 (e.g., a removable storage card) as the one or more memory dies 608. In some examples, the controller is formed on a die that is bonded to a memory die, in which case each memory die has its own controller. In other examples, a controller die controls all of the memory dies. Commands and data are transferred between the host 640 and controller 622 using a data bus 620, and between controller 622 and one or more of the memory dies 608 by way of lines 618. In one example, memory die 608 includes a set of input and/or output (I/O) pins that connect to lines 618.

Memory structure 626 may include one or more arrays of memory cells, including a 3D array. The memory structure may include a monolithic 3D memory structure in which multiple memory levels are formed above (e.g., and not in) a single substrate, such as a wafer, with no intervening substrates. The memory structure may include any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 610 cooperates with the read/write circuits 628 to perform memory operations (e.g., erase, program, read, and others) on memory structure 626, and includes a state machine 612, an on-chip address decoder 614, and a power control module 616. The state machine 612 provides chip-level control of memory operations. Temperature detection circuit 613 is configured to detect temperature, and can be any suitable temperature detection circuit known in the art. In one example, state machine 612 is programmable by the software. In other examples, state machine 612 does not use software and is completely implemented in hardware (e.g., electrical circuits). In one example, control circuitry 610 includes registers, ROM fuses, and other devices for storing default values such as base voltages and other parameters.

The on-chip address decoder 614 provides an address interface between addresses used by host 640 or controller 622 to the hardware address used by the decoders 624 and 632. Power control module 616 controls the power and voltages supplied to the word lines and bit lines during memory operations. It can include drivers for word line layers in a 3D configuration, select transistors (e.g., SGS and SGD transistors) and source lines. Power control module 616 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 610, state machine 612, decoders 614/624/632, temperature detection circuit 613, power control module 616, sense blocks 650, read/write circuits 628, and controller 622 can be considered one or more control circuits, or a managing circuit, that performs some or all of the functions described herein.

Controller 622, which in one example is an electrical circuit that may be on-chip or off-chip, may include one or more processors 622*c*, ROM 622*a*, RAM 622*b*, memory interface 622*d*, and host interface 622*e*, all of which are interconnected. One or more processors 622*c* is one example of a control circuit. Other examples can use state machines or other custom circuits designed to perform one or more functions. Devices such as ROM 622*a* and RAM 622*b* may include code such as a set of instructions, and the processor 622*c* may be operable to execute the set of instructions to provide some or all of the functionality described herein. Alternatively or additionally, processor 622*c* may access code from a memory device in the memory structure, such as a reserved area of memory cells connected to one or more word lines. Memory interface 622*d*, in communication with ROM 622*a*, RAM 622*b*, and processor 622*c*, is an electrical circuit that provides an electrical interface between controller 622 and memory die 608. For example, memory interface 622*d* can change the format or timing of signals, provide a buffer, isolate from surges, latch I/O, and so forth. Processor 622*c* may issues commands to control circuitry 610, or any other component of memory die 608, using memory interface 622*d*. Host interface 622*e*, in communication with ROM 622*a*, RAM 622*b*, and processor 622*c*, is an electrical circuit that provides an electrical interface between controller 622 and host 640. For example, host interface 622*e* can change the format or timing of signals, provide a buffer, isolate from surges, latch I/O, and so forth. Commands and data from host 640 are received by controller 622 by way of host interface 622*e*. Data sent to host 640 are transmitted using host interface 622*e*.

Multiple memory elements in memory structure 626 may be configured so that they are connected in series or so that each element is individually accessible. By way of non-limiting example, flash memory devices in a NAND configuration (e.g., NAND flash memory) typically contain memory elements connected in series. A NAND string is an example of a set of series-connected memory cells and select gate transistors.

A NAND flash memory array may be configured so that the array includes multiple NAND strings, where a NAND string includes multiple memory cells sharing a single bit line and that are accessed as a group. Alternatively, memory elements may be configured so that each element is individually accessible (e.g., a NOR memory array). NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

Some three-dimensional memory arrays are arranged so that memory cells occupy multiple planes or multiple memory device levels, thereby forming a structure in three dimensions (e.g., in the x, y, and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, such as in the y direction) with each column having multiple memory cells. The vertical columns may be arranged in a two-dimensional arrangement of memory cells, with memory cells on multiple vertically stacked memory planes. Other configurations of memory elements in three dimensions can also constitute a 3D memory array.

By way of non-limiting example, in a 3D NAND memory array, the memory elements may be coupled together to form vertical NAND strings that traverse across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

FIG. 8 is a block diagram of example storage device 600, depicting more details of controller 622. In one example, the system of FIG. 8 is a solid-state drive (SSD). As used herein, a flash memory controller is a device that manages data stored on flash memory and communicates with a host, such as a computer or other electronic device. A flash memory controller may have various functionalities in addition to the specific functionalities described herein. For example, the flash memory controller may format the flash memory to ensure the memory is operating properly, map out bad flash memory cells, and allocate spare memory cells to be substituted for future failed memory cells. Some part of the spare memory cells can be used to hold firmware to operate the flash memory controller and implement other features. During operation, when a host reads data from or writes data to the flash memory, the host will communicate with the flash memory controller. If the host provides a logical address to which data is to be read/written, the flash memory controller may convert the logical address received from the host to a physical address in the flash memory. Alternatively, in some examples, the host may provide the physical address. The flash memory controller may also perform various memory management functions such as, but not limited to, wear leveling (e.g., distributing writes to avoid wearing out specific blocks of memory that may otherwise be repeatedly written to) and garbage collection (e.g., after a block is full, moving only the valid pages of data to a new block, so the full block can be erased and reused). Non-volatile memories other than flash may have non-volatile memory controllers that are similar to flash memory controllers.

The communications interface between controller 622 and non-volatile memory dies 608 may be any suitable flash interface, such as toggle mode. In one example, storage device 600 may be a card based system, such as a secure digital (SD) or a micro secure digital (micro-SD) card. In another example, storage system 600 may be part of an embedded storage system. For example, the flash memory may be embedded within the host, such as in the form of a solid-state disk drive installed in a personal computer.

In some examples, storage system 600 includes a single channel between controller 622 and non-volatile memory dies 608. However, the subject matter described herein is not limited to having a single memory channel. For example, in some storage system architectures, two, four, eight, or more channels may exist between the controller and the memory dies 608 (e.g., depending on controller capabilities). In any of the examples described herein, more than a single channel may exist between the controller and the memory dies 608, even if a single channel is shown in the drawings.

As depicted in FIG. 8, controller 622 includes a front-end module 808 that interfaces with a host, a back-end module 810 that interfaces with the one or more non-volatile memory dies 608, and various other modules that perform functions which are described herein.

The components of controller 622 depicted in FIG. 8 may take the form of a packaged functional hardware unit (e.g., an electrical circuit) designed for use with other components, a portion of a program code (e.g., software or firmware) executable by processing circuitry that performs a particular function or related functions, or a self-contained hardware or software component that interfaces with a larger system. The controller 622 may include an application-specific integrated circuit (ASIC), a field programmable gate array (FPGA), a circuit, a digital logic circuit, an analog circuit, a combination of discrete circuits, gates, or any other type of hardware or combination thereof. The architecture depicted in FIG. 8 is one example implementation that may or may not use the components of controller 622 depicted in FIG. 7 (e.g., RAM, ROM, processor, interface).

Referring again to modules of the controller 622, a buffer manager/bus controller 814 manages buffers in random access memory (RAM) 816 and controls the internal bus arbitration of controller 622. A read-only memory (ROM) 818 stores system boot code. Although illustrated in FIG. 6 as located separately from the controller 622, in other examples, one or both of the RAM 816 and ROM 818 may be located both within the controller 622 and outside the controller 622. Further, in some implementations, the controller 622, RAM 816, and ROM 818 may be located on separate semiconductor dies.

Front-end module 808 includes a host interface 820 and a physical layer interface 822 (PHY) that provide the electrical interface with the host or next level storage controller. The choice of the type of host interface 820 can depend on the type of memory being used. Examples of host interfaces 820 include, for example, SATA, SATA Express, SAS, Fibre Channel, USB, PCIe, and NVMe. The host interface 820 may be a communication interface that facilitates transfer for data, control signals, and timing signals.

Back-end module 810 includes an error correction controller (ECC) engine 824 that encodes the data bytes received from the host and decodes and error corrects the data bytes read from the non-volatile memory. A command sequencer 826 generates command sequences, such as program and erase command sequences, to be transmitted to non-volatile memory dies 608. A RAID (redundant array of independent dies) module 828 manages generation of RAID parity and recovery of failed data. The RAID parity may be used as an additional level of integrity protection for the data being written into the storage device 600. In some cases, the RAID module 828 may be a part of the ECC engine 824. Note that the RAID parity may be added as an extra die or dies, or may be added within existing dies (e.g., as extra plane(s), extra block(s), or extra WL(s) within block(s). ECC engine 824 and RAID module 828 may calculate redundant data that can be used to recover when errors occur and may be considered examples of redundancy encoders. Together, ECC engine 824 and RAID module 828 may be considered to form a combined redundancy encoder 834. A memory interface 830 provides the command sequences to non-volatile memory die 608 and receives status information from non-volatile memory dies 608. In some examples, memory interface 830 may be a double data rate (DDR) interface. A flash control layer 832 controls the overall operation of back-end module 810.

Additional components of storage device 600 illustrated in FIG. 8 include media management layer 838, which performs wear leveling of memory cells of non-volatile memory dies 608. Storage device 600 also includes other discrete components 840, such as external electrical interfaces, external RAM, resistors, capacitors, or other components that may interface with controller 622. In other examples, one or more of the physical layer interface 822, media management layer 838, and buffer management/bus controller 814 are optional components that are not necessary in the controller 622.

The Flash Translation Layer (FTL) or Media Management Layer (MML) 838 may be integrated as part of the flash management that may handle flash errors and interfacing with the host. In particular, MML may be a module in flash management and may be responsible for the internals of NAND management. In particular, the MML 838 may include an algorithm in the storage device firmware which translates writes from the host into writes to the flash memory structure 626 of memory dies 608. The MML 838 may be used because, for example, the flash memory may have limited endurance, the flash memory structure 626 may only be written in multiples of pages, or the flash memory structure 626 may not be written unless it is erased as a block (e.g., a block may be considered to be a minimum unit of erase and such a non-volatile memory may be considered a block-erasable non-volatile memory). The MML 838 is configured to operate under these potential limitations of the flash memory structure 626, which may not be visible to the host. Accordingly, the MML 838 attempts to translate the writes from host into writes into the flash memory structure 626.

Controller 622 may interface with one or more memory dies 608. In one example, controller 622 and multiple memory dies 608 (e.g., together making up the storage device 600) implement an SSD, which can emulate, replace, or be used instead of a hard disk drive inside a host device, as a NAS device, or the like. Additionally, the SSD need not be made to work as a hard drive.

In an example, the present application describes a storage device, comprising: a substrate of a memory package that includes a first pin pad; a controller mounted on the substrate and electrically connected to the first pin pad, the controller being configured to manage data communications on a data channel; and a first memory die, comprising: a front pin pad electrically connected to the first pin pad of the substrate by way of a first bond wire; a rear pin pad; a first conductor segment electrically connecting the front pin pad and the rear pin pad of the first memory die; and a plurality of memory cells configured to provide non-volatile storage accessible by way of the data channel. In an example, the first conductor segment wraps at least once around one or more of the front pin pad and the rear pin pad. In an example, the first conductor segment forms a straight segment extending a portion of a distance between the front pin pad and toward the rear pin pad, wherein the first conductor segment also forms a coiled segment that at least partly wraps the rear pin pad. In an example, the rear pin pad is electrically connected to a pin pad of a second memory die by way of a second bond wire, thereby extending the data channel to at least the second memory die. In an example, the first conductor segment introduces an additional impedance on a segment of the channel between the front pin pad and the rear pin pad of the first memory die of at least 100 picohenry (pH). In an example, the additional impedance on the segment is between 300 and 500 picohenry (pH). In an example, the first conductor segment defines a conductor having a length of between 200 microns and 350 microns and a conductor width between 3 microns and 15 microns. In an example, the plurality of memory cells are electrically connected to the data channel by way of the rear pin pad of the first memory die. In an example, the first memory die further comprises one or more pairs of pin pads, each pair of pin pads being separated by other conductor segments that electrically connect each pin pad of the associated pair of pin pads by way of a single electrical circuit segment. In an example, the front and rear pin pads and the first conductor segment are formed on a top surface of the first memory die, wherein the first conductor segment is a conductor land.

The present application also describes a memory die, comprising: a first pin pad; a second pin pad; and a conductor segment electrically connecting the first pin pad and the second pin pad by way of a single electrical circuit segment of a predetermined length, the conductor segment being a conductor land formed onto a surface face of the memory die. In an example, the conductor land wraps at least once around one or more of the first pin pad and the second pin pad. In an example, the conductor land forms a straight segment extending a portion of a distance between the first pin pad and toward the second pin pad, wherein the conductor land also forms a coiled segment that at least partly wraps the second pin pad. In an example, the second pin pad is electrically connected to a pin pad of a second memory die by way of a second bond wire, thereby extending a data channel to at least the second memory die. In an example, the conductor land introduces an additional impedance on a segment between the first pin pad and the second pin pad of the first memory die of at least 100 picohenry (pH). In an example, the additional impedance on the segment is between 300 and 500 picohenry (pH). In an example, the conductor land defines a conductor having a length of between 200 microns and 350 microns and a conductor width between 3 microns and 15 microns. In an example, a plurality of memory cells are electrically connected to the second pin pad of the memory die. In an example, the first memory die further comprises one or more pairs of pin pads, each pair of pin pads being separated by other conductor segments that electrically connect each pin pad of the associated pair of pin pads by way of conductor lands.

The present application also describes a storage device, comprising: a substrate of a memory package that includes means for electrically connecting a first pin pad of the memory package to a controller, thereby defining a data channel for data communications between at least the memory package and the controller; and a first memory die comprising: means for electrically connecting a front pin pad of the first memory die to the first pin pad of the substrate; and means for electrically connecting the front pin pad and a rear pin pad of the first memory die by way of a conductor segment.

The term computer-readable media as used herein may include computer storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by a computing device. Any such computer storage media may be part of the computing device. Computer storage media does not include a carrier wave or other propagated or modulated data signal.

Additionally, examples described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various examples.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an example with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to examples of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute by way of the processor or other programmable data processing apparatus, create means for implementing the functions and/or acts specified in the schematic flowchart diagrams and/or schematic block diagrams block or blocks.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A storage device, comprising:
- a substrate of a memory package that includes a pin pad;
- a controller mounted on the substrate and electrically connected to the pin pad, the controller operable to manage data communications on a data channel; and
- a memory die, comprising:
  - a front pin pad electrically connected to the pin pad of the substrate by way of a bond wire;
  - a rear pin pad;
  - a conductor segment electrically connecting the front pin pad and the rear pin pad of the first memory die, wherein at least a portion of the conductor segment wraps at least partially around one or more of the front pin pad and the rear pin pad; and
  - a plurality of memory cells providing non-volatile storage accessible by way of the data channel.

2. The storage device of claim 1, wherein the at least the portion of the conductor segment is a first portion of the conductor segment and wherein a second portion of the conductor segment forms a straight segment extending, at least partially, a distance between the front pin pad and the rear pin pad, wherein the at least the first portion of the conductor segment forms a coiled segment that at least partly wraps the rear pin pad.

3. The storage device of claim 1, wherein the memory die is a first memory die and the bond wire is a first bond wire and wherein the rear pin pad is electrically connected to a pin pad of a second memory die by way of a second bond wire, thereby extending the data channel to at least the second memory die.

4. The storage device of claim 1, wherein the first conductor segment introduces an additional impedance on a segment of the channel between the front pin pad and the rear pin pad of the memory die of at least 100 picohenry (pH).

5. The storage device of claim 4, wherein the additional impedance on the segment of the channel is between 300 and 500 picohenry (pH).

6. The storage device of claim 1, wherein the conductor segment defines a conductor having a length between 200 microns and 350 microns and a conductor width between 3 microns and 15 microns.

7. The storage device of claim 1, wherein the plurality of memory cells are electrically connected to the data channel by way of the rear pin pad of the first memory die.

8. The storage device of claim 1, wherein the memory die further comprises one or more pairs of pin pads, each pair of pin pads being separated by other conductor segments that electrically connect each pin pad of the associated pair of pin pads by way of a single electrical circuit segment.

9. The storage device of claim 1, wherein the front pin pad and the rear pin pad and the conductor segment are formed on a top surface of the memory die, and wherein the conductor segment is a conductor land.

10. A memory die, comprising:

a first pin pad;

a second pin pad; and a conductor segment electrically connecting the first pin pad and the second pin pad by way of a single electrical circuit segment, the conductor segment being a conductor land formed onto a surface face of the memory die and at least partially surrounding at least one of the first pin pad and the second pin pad.

11. The memory die of claim 10, wherein the second pin pad is electrically connected to a pin pad of a second memory die by way of a bond wire.

12. The memory die of claim 10, wherein the conductor land introduces an additional impedance on a segment between the first pin pad and the second pin pad of the memory die of at least 100 picohenry (pH).

13. The memory die of claim 12, wherein the additional impedance on the segment is between 300 and 500 picohenry (pH).

14. The memory die of claim 10, wherein the conductor land defines a conductor having a length between 200 microns and 350 microns and a conductor width between 3 microns and 15 microns.

15. The memory die of claim 10, wherein a plurality of memory cells are electrically connected to the second pin pad of the memory die.

16. The memory die of claim 10, wherein the first memory die further comprises one or more pairs of pin pads, each pair of pin pads being separated by other conductor segments that electrically connect each pin pad of the associated pair of pin pads by way of conductor lands.

17. The memory die of claim 10, wherein the at least a portion of the conductor segment that at least partially surrounds the at least one of the first pin pad and the second pin pad forms a geometric shape.

18. A storage device, comprising:

a substrate of a memory package that includes means for electrically connecting a first pin pad of the memory package to a controller, thereby defining a data channel for data communications between at least the memory package and the controller; and a first memory die comprising:

means for electrically connecting a front pin pad of the first memory die to the first pin pad of the substrate; and means for electrically connecting the front pin pad and a rear pin pad of the first memory die by way of a conductor segment, wherein at least a portion of the conductor segment wraps at least partially around one or more of the front pin pad and the rear pin pad.

19. The storage device of claim 18, wherein the conductor segment introduces an additional impedance on a segment of the data channel between the front pin pad and the rear pin pad of the first memory die of at least 100 picohenry (pH).

20. The storage device of claim 18, wherein the at least the portion of the conductor segment that wraps at least partially around the one or more of the front pin pad and the rear pin pad connects to a via that extends to a lower layer of the first memory die.

* * * * *